(12) United States Patent
Göbl et al.

(10) Patent No.: US 7,042,074 B2
(45) Date of Patent: May 9, 2006

(54) POWER SEMICONDUCTOR MODULE AND METHOD FOR PRODUCING IT

(75) Inventors: Christian Göbl, Nuremberg (DE); Heinrich Heilbronner, Stein (DE)

(73) Assignee: SEMIKRON Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 10/998,692

(22) Filed: Nov. 29, 2004

(65) Prior Publication Data

US 2005/0127503 A1    Jun. 16, 2005

(30) Foreign Application Priority Data

Nov. 29, 2003    (DE)    ................. 103 55 925

(51) Int. Cl.
*H01L 23/02*    (2006.01)
*H01L 23/34*    (2006.01)

(52) U.S. Cl. ............... 257/678; 257/691; 257/723; 257/774; 257/775

(58) Field of Classification Search .......... 257/497, 257/500, 502, 503, 691, 723, 724, 775, 910, 257/678, E23.019, E23.02, E23.021, E23.023
See application file for complete search history.

(56) References Cited

U.S. PATENT DOCUMENTS

| 4,783,695 A | * | 11/1988 | Eichelberger et al. | ...... 257/668 |
| 5,091,769 A | * | 2/1992 | Eichelberger | ................ 257/687 |
| 5,291,066 A | * | 3/1994 | Neugebauer et al. | ........ 257/750 |
| 5,565,706 A | * | 10/1996 | Miura et al. | ................. 257/723 |
| 5,757,072 A | * | 5/1998 | Gorowitz et al. | ............ 257/700 |
| 5,841,193 A | * | 11/1998 | Eichelberger | ................ 257/723 |
| 5,856,913 A | | 1/1999 | Heilbronner | |
| 5,886,401 A | * | 3/1999 | Liu | ............................. 257/678 |
| 5,998,859 A | * | 12/1999 | Griswold et al. | ........... 257/679 |
| 6,060,772 A | * | 5/2000 | Sugawara et al. | .......... 257/678 |
| 6,154,366 A | * | 11/2000 | Ma et al. | ..................... 361/704 |
| 6,396,148 B1 | * | 5/2002 | Eichelberger et al. | ...... 257/758 |
| 6,707,124 B1 | * | 3/2004 | Wachtler et al. | ............ 257/433 |
| 6,756,667 B1 | * | 6/2004 | Hiyoshi | ....................... 257/703 |
| 6,825,553 B1 | * | 11/2004 | Chua et al. | .................. 257/691 |
| 6,914,321 B1 | * | 7/2005 | Shinohara | .................... 257/678 |
| 2004/0155325 A1 | * | 8/2004 | Ma et al. | ..................... 257/678 |
| 2004/0169264 A1 | * | 9/2004 | Lee et al. | .................... 257/678 |

FOREIGN PATENT DOCUMENTS

| DE | 41 30 637 A1 | 4/1992 |
| DE | 196 17 055 C1 | 6/1997 |
| DE | 100 37 819 A1 | 2/2002 |
| DE | 101 21 970 A1 | 11/2002 |
| DE | 102 58 565 B3 | 8/2004 |

* cited by examiner

*Primary Examiner*—Jasmine Clark
(74) *Attorney, Agent, or Firm*—Cohen, Pontani, Lieberman & Pavane

(57) ABSTRACT

A power semiconductor module and a method for producing it, wherein the module includes a substrate, with conductor tracks disposed on it to suit circuitry with which the module is used and with power semiconductor components disposed on the conductor tracks. Also disposed on the conductor tracks are spacer elements and a foil composite that includes two metal foil layers with an electrically insulating foil layer disposed between them. The foil composite has contact humps and plated-through holes. At least one of the metal foil layers is structured in a manner to suit the circuitry with which the module is used, and this foil composite is durably connected to the power semiconductor components and to the spacer elements, preferably by ultrasonic welding.

2 Claims, 3 Drawing Sheets

POWER SEMICONDUCTOR MODULE AND METHOD FOR PRODUCING IT

BACKGROUND OF THE INVENTION

1. Field of the Invention

The invention is directed to a power semiconductor module and a method for producing a power semiconductor module, and more particularly, to a method and apparatus for connecting semiconductor components, especially power semiconductor components such as transistors, thyristors or diodes, with one another and/or with associated supply leads.

2. Description of the Related Art

Such power semiconductor modules are the subject of constant research, directed toward increasing their performance and reliability, lengthening their service life, and simultaneously reducing their production cost and size.

The points of departure for the invention are the following German Patent Applications of the assignee of the present application: DE 101 21 970 A1, and DE 102 58 565, the latter not having been published by the priority date of the present application. DE 101 21 970 discloses a power semiconductor module comprising a substrate with conductor tracks structured on it to suit circuitry with which the module is used and power semiconductor components disposed on the conductor tracks. A flexible printed circuit board contacts these power semiconductor components. The through-plating is effected by means of an elastic pressure reservoir and a pressure-introducing pressure plate. A disadvantage of this structure is that because of the bending radii of the flexible printed circuit board that is necessary for contacting the power semiconductor components and the conductor tracks of the substrate, the module cannot have a compact structure. Another disadvantage is that adjusting the flexible printed circuit board to the power semiconductor components, disposed on the substrate beforehand, and the other contact faces is complicated and expensive.

DE 102 58 565 discloses a power semiconductor module of the plated-through hole type with two metal supply leads; the introduction of pressure is done via these two supply leads. An insulation layer with plated-through holes is disposed between the power semiconductor components and the supply leads. The wiring course of the control terminals is embedded in this insulation layer. A disadvantage of this embodiment of the power semiconductor module is that complex circuit topologies cannot be produced with the disclosed structure. Another disadvantage is that production is very complex and expensive because of the adjustment of multiple layers (the first supply lead, the substrate with the power semiconductor components, at least one insulation layer, and the second supply lead) to one another.

Other fundamental references for the invention are German Patent DE 196 17 055 C1 (which corresponds to U.S. Pat. No. 5,856,913) and German Patent Applications DE 41 30 637 A1 and DE 100 37 819 A1. DE 196 17 055 C1 discloses a power semiconductor module with a substrate, with conductor tracks, with power semiconductor components, and with a foil composite comprising a plurality of metal foil layers structured to suit the circuitry, with an electrically insulating foil layer between them; this foil composite also has plated-through holes. What proved disadvantageous here are the recesses in the prepregs, which can sometimes cause severe curvatures of the foil composite if a compact structure is to be attained.

DE 41 30 637 A1 discloses the production of a power semiconductor module having the following steps:

producing a foil composite from a metal foil layer and an electrically insulating layer;
structuring the metal foil layer to suit the circuitry; and
producing plated-through holes and contact humps.

A disadvantage of this production method is that contact points to the semiconductor component or to the substrate with solder or adhesive must be provided in a further work step, and that it lacks disclosure of the possibility of connecting electrically connecting auxiliary terminals and control terminals.

DE 100 37 819 A1 discloses a construction of a connecting element comprising two metal layers and an electrically insulating layer disposed between them. However, the method has complex, expensive steps, such as a deep etching process of the first metal layer.

SUMMARY OF THE INVENTION

The object of the present invention is to present a power semiconductor module and an associated production method where the power semiconductor module is designed reliably and extremely compactly, and the production method enables automated production with a low number of individual steps.

The two parts of this object are attained by a power semiconductor module and a production method as claimed.

The fundamental concept of the inventive power semiconductor module is based on known constructions having a substrate, conductor tracks disposed thereon in a manner to suit the circuitry with which the module is used, and power semiconductor components disposed on the conductor tracks, and a further technique for connecting these power semiconductor components to one another, to the conductor tracks, and/or to supply leads for external contact. The connecting technique of the invention is based on using at least one foil composite comprising two metal foils with an electrically insulating foil layer disposed between them; wherein at least one metal foil layer is structured in a manner to suit the circuitry with which the module is used.

The inventive power semiconductor module preferably has further components, known as spacer elements. These spacer elements in turn, within technological limits, have approximately the same thickness as the power semiconductor components. Both these spacer elements and the power semiconductor components are disposed with one main face thereof on the conductor tracks of the substrate. At least one foil composite is disposed on the opposite main faces of the spacer elements and power semiconductor components. For connecting to the power semiconductor components and/or the spacer elements, this foil composite preferably has stamped contact humps. These contact humps of the foil composite are durably and reliably bonded to the spacer elements and/or power semiconductor components by means, for example, of ultrasonic welding.

The associated method for producing such a power semiconductor module comprises the following steps. In a first step, a foil composite is produced from at least two metal foil layers and an electrically insulating foil layer placed therebetween. Preferably, the individual foil layers are fixed to one another by adhesive bonding. Next, at least one metal foil layer of the foil composite is configured to suit the circuitry with which the module is used. Plated-through holes to suit the circuitry are also produced between various metal foil layers. Next, contact humps are generated, preferably by stamping. The foil composite is durably bonded at these contact humps to both the power semiconductor components and the spacer elements, preferably by ultrasonic welding. The composite of the foil composite, power semiconductor components and spacer elements is then disposed on the conductor tracks of the substrate, preferably by pressure bonding, soldering or adhesive bonding.

The characteristics and features of the invention are described below as examples in conjunction with FIGS. 1 through 5.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PREFERRED EMBODIMENTS

Figure 1:
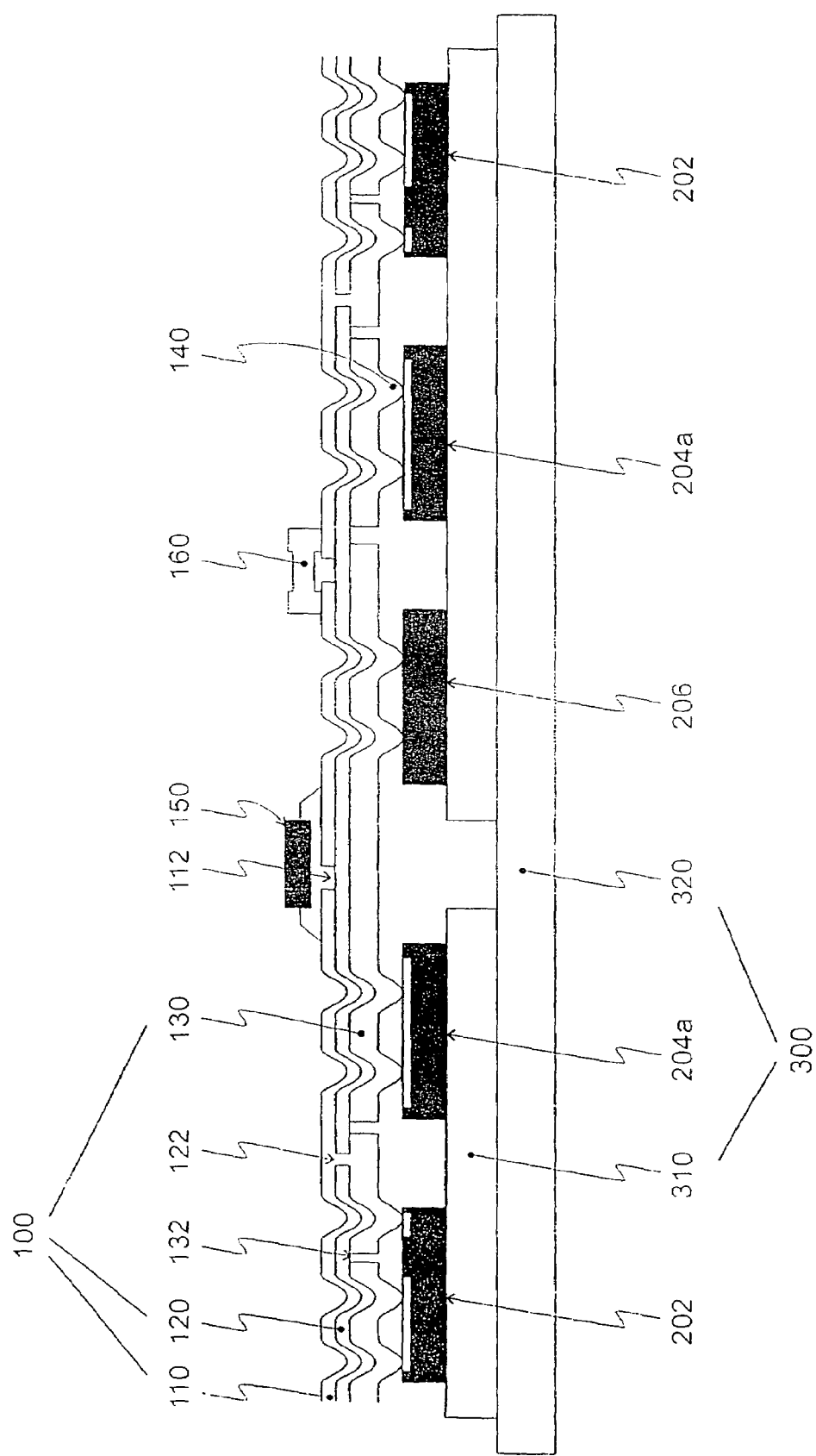
FIG. 1 shows a sectional view of an embodiment of a power semiconductor module of the invention.
Figure 4:
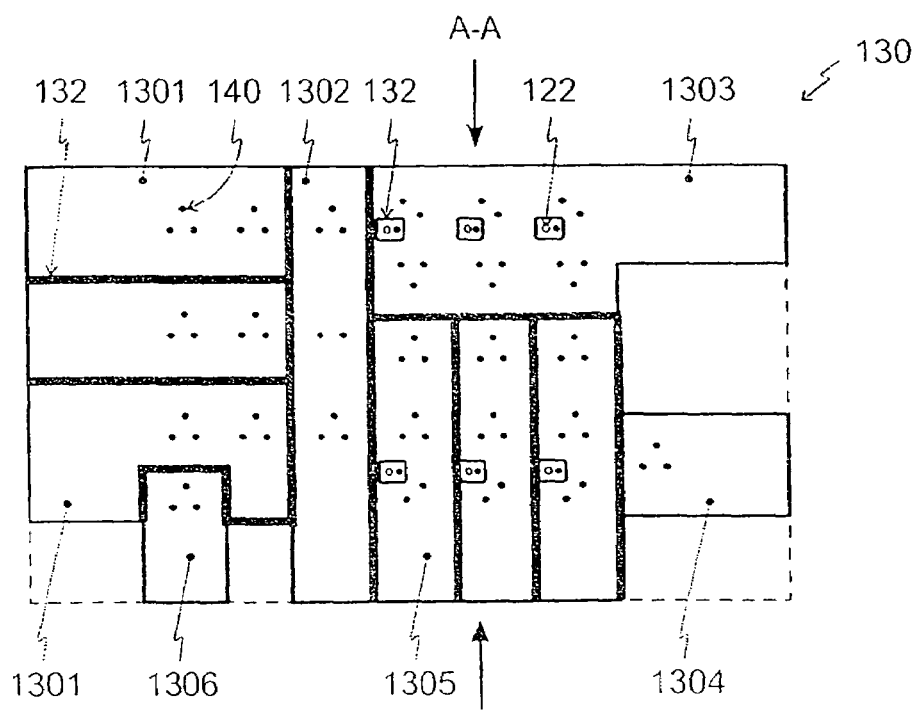
FIG. 4 shows a plan view of the embodiment of a second metal foil layer of a power semiconductor module of the invention.
Figure 5:
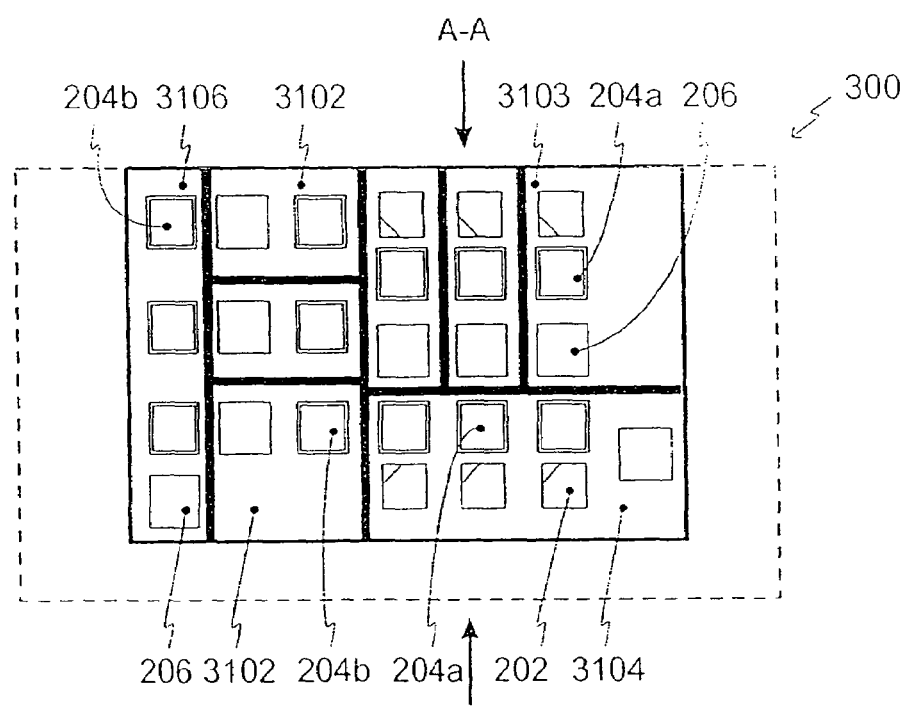
FIG. 5 shows a plan view of the embodiment of a substrate of a power semiconductor module of the invention.

FIG. 1 shows an embodiment of a power semiconductor module of the invention in a sectional view taken along the line A—A of FIGS. 4 and 5. This power semiconductor module comprises a substrate 300, which in turn comprises an insulating body 320 and conductor tracks 310 that are disposed on insulating body 320 and structured to suit the circuitry with which the module is used. A composite of power semiconductor components 202, 204, spacer elements 206, and a foil composite 100 is disposed on conductor tracks 310. To that end, composite 100 is soldered to conductor tracks 310. Known alternatives to this procedure are adhesive bonds or a plated-through hole.

The composite of power semiconductor components 202, 204, spacer elements 206 and foil composite 100 is in turn created by means of an ultrasonic welded connection of stamped contact humps 140 of foil composite 100 to spacer elements 206 and power semiconductor components 202, 204.

Foil composite 100 itself comprises a copper foil 110, forming the first metal foil layer, preferably having a thickness of between about 10 µm and about 50 µm; an electrically insulating plastic foil 120, preferably having a thickness of between about 10 µm and about 50 µm; and an aluminum foil 130, forming the second metal foil layer, preferably having a thickness of between about 100 µm and about 400 µm. These individual foil layers 110, 120, 130 are joined by adhesive bonding. Copper foil 110 serves as the conductor track of the control and auxiliary terminals, such as the gate terminals, the auxiliary emitter terminals, or the terminals of sensor system components. Aluminum foil 130 serves as a conductor track for the load terminals of the power semiconductor module. Advantageously, both metal foils 110, 130 are intrinsically structured such as by apertures 112, 132, respectively, for this purpose. To make auxiliary emitter terminals, for instance, the foil composite has plated-through holes 122 between the two metal foils 110, 130.

These plated-through holes 122 can preferably be produced by laser drilling and ensuing laser-supported filling with a conductive material. Plated-through holes 122 having a diameter of a few hundred micrometers are possible.

Further components can be disposed on copper foil 110, such as sensor system components, resistors 160, capacitors, coils, and/or integrated circuits 150. For this purpose, bonds made by soldering are preferred. Such components 150, 160 disposed there may take over individual functions involved in triggering the power semiconductor module. The entire driver circuit may also be disposed here.

Spacer elements 206 serve the purpose of making electrical contact between foil composite 100 and conductor tracks 310 of substrate 300. Since in compact constructions of the power semiconductor module, foil composite 100 cannot be put into direct contact with conductor tracks 310 of substrate 300, spacer elements 206 form an electrically conductive connection therebetween. Preferably, spacer elements 206 are designed as aluminum blocks with a height of ±10% of the height of power semiconductor components 202, 204.

Figure 2:
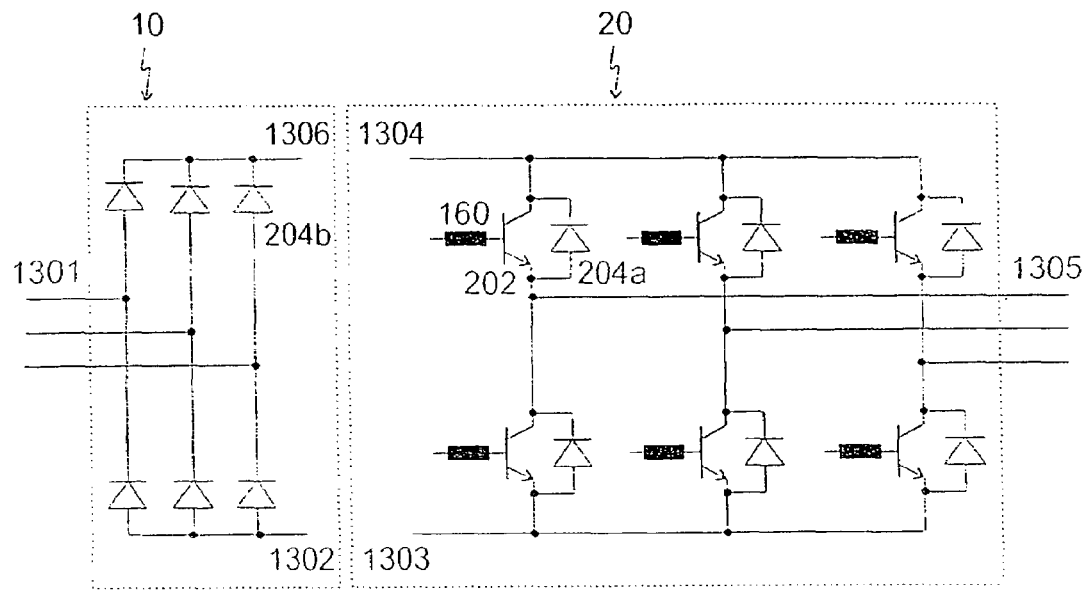
FIG. 2 shows an exemplary circuit arrangement embodied by a power semiconductor module of the invention.

FIG. 2 shows as an example a circuit arrangement designed by means of a power semiconductor module of the invention. What is shown is the known circuit arrangement of a converter, without showing a direct-current intermediate circuit, since that circuit is not an integral component of the power semiconductor module shown as an example. The input of this converter is formed by three alternating-current phases 1301. These phases are rectified by means of a bridge rectifier 10 constructed of six identical diodes 204b. Bridge rectifier 10 has one positive output 1306 and one negative output 1302.

The second part of the circuit arrangement is an inverter 20 having a positive direct-voltage input 1304 and a negative direct-voltage input 1303 as well as three identical half-bridge circuits. Each half-bridge circuit comprises one upper and one lower power semiconductor switch, in this case a respective IGBT 202, each with an antiparallel-connected free-wheeling diode 204a. A series resister 160 is placed in front of each gate of an IGBT 202. The output of inverter 1305 is formed by the three alternating-voltage phases.

Figure 3:
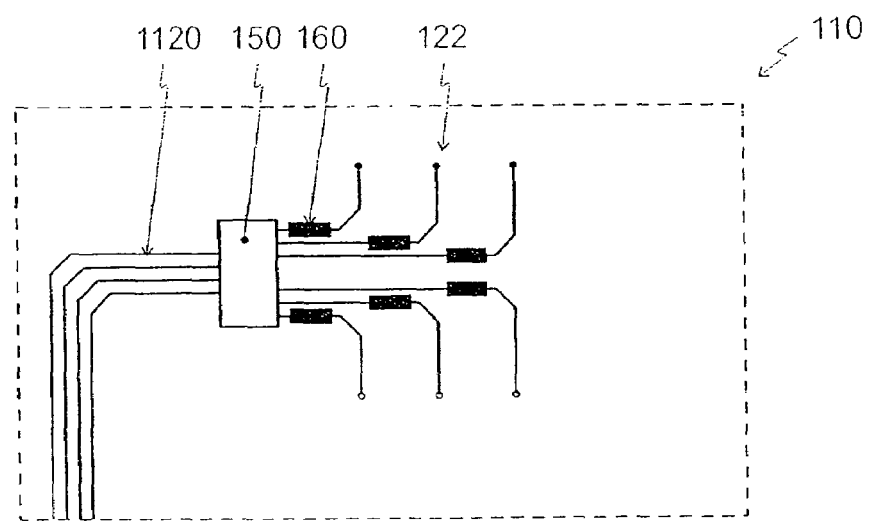
FIG. 3 shows a plan view of the embodiment of a first metal foil layer of a power semiconductor module of the invention.

FIG. 3 shows the embodiment of a first metal foil layer, in this case copper foil 110, of the power semiconductor module of the invention shown in FIG. 1. In comparison to FIG. 1, what is shown here is the plan view as seen from the direction of foil composite 100. This view is also shown in FIGS. 4 and 5. The dashed line in FIGS. 3 through 5 symbolizes the outermost edge of the power semiconductor module with foil composite 100, spacer elements 206, power semiconductor components 202, 204, and substrate 300.

Copper foil 110 shown is intrinsically structured so that a plurality of individual conductor tracks 1120 are formed. These conductor tracks 1120 connect an external controller (not shown), to an integrated circuit 150 for triggering the gates of power transistors (see FIG. 5). Other supply lines for control and auxiliary contacting means, such as auxiliary emitters or sensor system components not shown here, are also embodied as conductor tracks 1120 of copper foil 110.

For the connections required for them, the copper foil has plated-through holes 122 to insulated regions of the aluminum foil (see FIG. 4), which from there are bonded for instance to the gates of external power transistors. Resistors 160, for example gate series resistors as shown, are also disposed on copper foil 110, between integrated circuit 150 and plated-through holes 122.

FIG. 4 shows the embodiment of a further metal foil layer, in this case of aluminum foil 130, of the power semiconductor module of the invention shown in FIG. 1, in the same plan view as that described for FIG. 3. Aluminum foil 130 is structured 132 into individual conductor tracks 1301, 1302, 1303, 1304, 1305, 1306. The individual conductor tracks are named in the same way as the terminals in FIG. 2. Thus, three identical conductor tracks 1301 are associated with the three input phases, and the three identical conductor tracks 1305 are associated with the three output phases. The direct-voltage outputs of the rectifier are formed by the associated conductor tracks 1302, 1306, and the direct-voltage inputs of the inverter are formed by the associated conductor tracks 1303, 1304. All the power contact means are thus embodied as defined regions of aluminum foil 130.

The conductor tracks of aluminum foil 130 have stamped contact humps 140 for connection to the spacer elements 206 and to power semiconductor components 202, 204 (see FIG. 5). Aluminum foil 130 also has isolated regions of plated-through holes, beginning at copper foil 110 (see FIG. 3).

FIG. 5 shows the embodiment of the substrate 300 of a power semiconductor module of the invention. Individual conductor tracks 3102, 3103, 3104, 3106, insulated from one another, are disposed on an insulating body. The associated power semiconductor components and the spacer elements are disposed on these conductor tracks. The three input phases of bridge rectifier 10 are connected to the anodes of diodes 204b disposed on conductor tracks 3106, via associated conductor tracks 1301 of aluminum foil 130 (see FIG. 4), and to the cathodes of diodes 204b, also located there, via spacer elements 206 disposed on conductor tracks 3102 of aluminum foil 130. The anodes of diodes 204b are connected to conductor track 1302 and thus to the associated negative output of the bridge rectifier. The positive output is formed by conductor track 3106 of substrate 300, which is connected to conductor track 1306 of aluminum foil 130 via spacer element 206.

The positive direct-voltage input of the inverter corresponds to the associated conductor track 1304 of aluminum foil 130. This conductor track 1304 is connected to the conductor track 3104 of substrate 300 via a spacer element 206 and is thus connected to the collectors of the three upper power transistors 202 as well as to the cathodes of the associated antiparallel-connected diodes 204a. The emitters of power transistors 202, like the anodes of associated diodes 204a, are connected to the three conductor tracks 1305 of aluminum foil 130. These conductor tracks are connected via spacer elements 206 to three conductor tracks 3103 of substrate 300 and thus to the collectors of lower power transistors 202 and to the associated cathodes of the antiparallel-connected diodes 204a. Simultaneously, three conductor tracks 1305 of aluminum foil 130 serve as alternating-voltage outputs of the inverter. The emitters of lower power transistors 202 and the associated anodes of diodes 204a are connected to conductor track 1303 and thus to the associated negative direct-voltage terminal of the inverter.

The production method of the invention will also be explained below in conjunction with FIGS. 3 through 5. The point of departure is the production of a foil composite comprising a copper foil 110, having a thickness of between about 10 μm and about 50 μm; an electrically insulating plastic foil 120, having a thickness of between about 10 μm and about 50 μm; and an aluminum foil 130, having a thickness of between about 100 μm and about 400 μm. Foils 110, 120, 130, are joined to one another by adhesive bonding, with an adhesive layer approximately 13 μm thick in each case, and after that are available as goods on rolls for further processing. A breakdown voltage between the metal foils of more than 3 kV is attained here.

In the next processing step, both metal foils are structured on both sides by masking and an ensuing wet-chemical process, by etching out trenches 112, 132 therein. Conductor tracks 1120 of the auxiliary and control terminals on copper foil 110 are formed in the process, and those of the load terminals or load connections are formed on aluminum foil 130. Also in this process, the requisite contact islands, isolated from the other conductor tracks, are formed on aluminum foil 130.

For auxiliary and control terminals, in the next method step plated-through holes 122 are embodied between aluminum foil 130 and copper foil 110. To that end, blind bores are drilled by a laser through copper foil 110 and insulating foil 120 as far as into aluminum foil 130, and these bores are then filled with a metal material. Such plated-through holes 122, for auxiliary emitters, for instance, connect conductor tracks of copper foil 110 to conductor tracks of the load terminals or load connections of aluminum foil 130. Conductor tracks for control terminals on copper foil 110 are joined by the same kind of plated-through holes 122 to contact islands on aluminum foil 130.

In the next method step, contact humps 140 are made in foil composite 100. To that end, contact humps 140 on aluminum foil 130 are stamped on copper foil 110. The two other foils 110, 120 conform to this contour thus formed. This does not hinder the function of insulating foil layer 120.

The spacer elements and the power semiconductor components are durably connected electrically conductively to the contact humps of the foil composite, preferably by ultrasonic welding. This creates a composite comprising power semiconductor components and their "wiring", or in other words, their foil composite 100. This composite is simple and can be produced without a large number of serial processes, such as are necessary in the prior art for wire bond connections.

This composite produced up to this point is now disposed on the substrate by known methods, such as soldering, adhesive bonding with conductive adhesives, or by means of a pressure-contacting method. This creates an extremely compact, stable construction of a power semiconductor module, which can be disposed in a required housing by known methods.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module for use with circuitry, the module comprising:
   at least one substrate;
   conductor tracks disposed on at least one of said at least one substrate;
   power semiconductor components disposed on said conductor tracks;
   spacer elements disposed on said conductor tracks; and
   at least one foil composite having:
   at least first and second metal foil layers;
   an electrically insulating foil layer disposed between each adjacent pair of metal foil layers,
   contact humps; and
   plated-through holes therein;
   wherein at least one of said metal foil layers is configured to suit said circuitry; and
   wherein said foil composite is durably bonded to said power semiconductor components and said spacer elements by means of ultrasonic welding.

2. The power semiconductor module of claim 1, wherein said foil composite includes a copper foil having a thickness of between about 10 μm and about 50 μm, as said metal foil layer; an electrically insulating plastic foil with a thickness of between about 10 μm and about 50 μm, and an aluminum foil with a thickness of between about 100 μm and about 400 μm, as said second metal foil layer, and
wherein first and second metal foil layers are joined together by adhesive bonds.

* * * * *